US006921625B2

(12) United States Patent
Kaczun et al.

(10) Patent No.: US 6,921,625 B2
(45) Date of Patent: Jul. 26, 2005

(54) METHOD FOR THE PRODUCTION OF FLEXOGRAPHIC PRINTING FORMS BY MEANS OF ELECTRON BEAM CROSS-LINKING AND LASER ENGRAVING

(75) Inventors: Jürgen Kaczun, Wachenheim (DE); Jens Schadebrodt, Mainz (DE); Margit Hiller, Karlstadt (DE)

(73) Assignee: BASF Drucksysteme GmbH, Stuttgart (DE)

(*) Notice: Subject to any disclaimer, the term of this patent is extended or adjusted under 35 U.S.C. 154(b) by 0 days.

(21) Appl. No.: 10/484,237

(22) PCT Filed: Jul. 18, 2002

(86) PCT No.: PCT/EP02/08013

§ 371 (c)(1),
(2), (4) Date: Jan. 20, 2004

(87) PCT Pub. No.: WO03/011596

PCT Pub. Date: Feb. 13, 2003

(65) Prior Publication Data

US 2004/0197711 A1 Oct. 7, 2004

(30) Foreign Application Priority Data

Jul. 27, 2001 (DE) ........................................ 101 36 477

(51) Int. Cl.[7] .................................................. G03F 7/20

(52) U.S. Cl. ................. 430/306; 430/281.1; 430/286.1; 430/494; 430/944; 430/945

(58) Field of Search ........................... 430/281.1, 286.1, 430/306, 494, 944, 945

(56) References Cited

U.S. PATENT DOCUMENTS

| | | | | | |
|---|---|---|---|---|---|
| 4,384,011 | A | | 5/1983 | Aoyama et al. | |
| 5,259,311 | A | | 11/1993 | McCaughey, Jr. | |
| 5,798,202 | A | | 8/1998 | Cushner et al. | |
| 5,804,353 | A | * | 9/1998 | Cushner et al. | 430/306 |
| 6,776,095 | B2 | * | 8/2004 | Telser et al. | 101/401.1 |
| 2004/0259022 | A1 | * | 12/2004 | Hiller et al. | 430/270.1 |

FOREIGN PATENT DOCUMENTS

| | | |
|---|---|---|
| DE | 199 18363 | 10/2000 |
| WO | 93/23252 | 11/1993 |
| WO | 93/23253 | 11/1993 |

OTHER PUBLICATIONS

Technik des Flexo drucks, 173–177.
2201–017252/03 Derwent Abst.

* cited by examiner

*Primary Examiner*—Barbara L. Gilliam
(74) *Attorney, Agent, or Firm*—Novack Druce & Quigg

(57) ABSTRACT

A method for the production of flexographic printing forms by means of laser engraving, wherein at least one elastomer relief layer is applied to a dimensionally-stable carrier. The relief layer comprises at least one elastomer binding agent and at least one absorber for laser radiation; the relief layer is entirely cross-linked by means of electron radiation at a minimum overall dose of 40 kGy; a printed relief is engraved into the cross-linked relief layer by means of a laser. The invention also relates to flexographic printing forms which can be obtained according to said method.

27 Claims, No Drawings

METHOD FOR THE PRODUCTION OF FLEXOGRAPHIC PRINTING FORMS BY MEANS OF ELECTRON BEAM CROSS-LINKING AND LASER ENGRAVING

The present invention relates to a process for the production of flexographic printing plates by means of laser engraving by application of at least one elastomeric relief layer to a dimensionally stable substrate, the relief layer comprising at least one elastomeric binder and at least one absorber for laser radiation, uniform crosslinking of the relief layer by means of electron beams in a minimum total dose of 40 kGy and engraving of a printing relief into the crosslinked relief layer by means of a laser. The present invention furthermore relates to flexographic printing plates obtainable by the process.

In the direct laser engraving technique for the production of flexographic printing plates, a relief suitable for printing is engraved directly into a relief layer suitable for this purpose. The engraving of rubber impression cylinders by means of lasers has been known in principle since the late 60s. However, this technique did not attract wider commercial interest until recent years with the arrival of improved laser systems. The improvements in the laser systems include better focusability of the laser beam, higher power and computer-controlled beam guidance.

Direct laser engraving has several advantages over the conventional production of flexographic printing plates. A number of time-consuming process steps, such as creation of a photographic negative or development and drying of the printing plate, can be dispensed with. Furthermore, the sidewall shape of the individual relief elements can be individually formed in the laser engraving technique. Whereas in photopolymer plates the sidewalls of a relief dot diverge continuously from the surface to the relief base, a sidewall which is perpendicular or virtually perpendicular in the upper region and broadens only in the lower region can also be engraved by means of laser engraving. Consequently, there is little or no increase in tonal value even with increasing wear of the plate during the printing process. Further details of the laser engraving technique appear, for example, in Technik des Flexodrucks, page 173 et seq., 4th Edition, 1999, Coating Verlag, St. Gallen, Switzerland.

In principle, commercial photopolymerizable flexographic printing elements can be used for the production of flexographic printing plates by means of laser engraving. U.S. Pat. No. 5,259,311 discloses a process in which the flexographic printing element is photochemically crosslinked by uniform exposure in a first step and a printing relief is engraved by means of a laser in a second step.

EP-A 640 043 and EP-A 640 044 disclose single-layer and multilayer elastomeric laser-engravable recording elements, respectively, for the production of flexographic printing plates. The elements consist of reinforced elastomeric layers. For the production of the layer, elastomeric binders, in particular thermoplastic elastomers, for example SBS, SIS or SEBS block copolymers, are used. As a result of the reinforcement, the mechanical strength of the layer is increased in order to permit flexographic printing. The reinforcement is achieved either by introduction of suitable fillers, photochemical or thermo chemical crosslinking or combinations thereof.

A precondition for the production of flexographic printing plates by means of laser engraving is that the laser radiation is first absorbed by the relief layer. Below a specific threshold energy which must be introduced into the relief layer, no engraving is in general possible. Above the threshold energy, the speed or efficiency of the engraving depends on the energy absorbed per unit time. The absorbance of the relief layer for the laser radiation chosen in each case should therefore be as high as possible.

In the laser engraving of flexographic printing elements, large amounts of material must be removed. Powerful lasers are therefore required. $CO_2$ lasers having a wavelength of 10 640 nm can be used for the laser engraving of flexographic printing plates. Very powerful $CO_2$ lasers are commercially available. The elastomeric binders which are usually used for flexographic printing plates generally absorb radiation having a wavelength in the region of about 10 $\mu$m. They can in principle therefore be engraved using $CO_2$ lasers (wavelength of 10 640 nm), as disclosed, for example, by U.S. Pat. No. 5,259,311, even if the engraving speed is not always optimum. Furthermore, the achievable resolution and hence the quality of the printing plate on engraving with $CO_2$ lasers are limited. In addition to physical limits which exist in any case, the beam becomes increasingly difficult to focus with increasing power.

Solid-state lasers having wavelengths in the region of 1 $\mu$m can also be used for the laser engraving of flexographic printing elements. For example, powerful Nd-YAG lasers (wavelength 1 064 nm) can be used. Compared with $CO_2$ lasers, Nd-YAG lasers have the advantage that considerably higher resolutions are possible owing to the substantially shorter wavelength. In general, however, elastomeric binders of flexographic printing plates do not absorb the wavelength of solid-state lasers or do so only poorly.

It has been proposed that substances absorbing IR radiation be mixed with the relief layer for increasing the sensitivity. When Nd-YAG lasers are used, engraving is as a rule permitted only through the use of IR absorbers. In the case of $CO_2$ lasers, the engraving speed can be increased. Suitable absorbers are disclosed in EP-A 640 043 and EP-A 640 044 and comprise strongly colored pigments, such as carbon black, or IR-absorbing dyes which are also usually strongly colored.

The use of strongly colored IR absorbers results in the relief layers being substantially opaque in the UV/VIS range too. Such layers therefore cannot be photochemically reinforced or crosslinked since the depth of penetration of the actinic radiation is extremely limited owing to the very strong absorption. As a solution, EP-B 640 043 therefore proposes producing a thick layer by casting a multiplicity of thin layers, followed in each case by photochemical crosslinking of each individual layer. However, this procedure is inconvenient and expensive. Moreover, the adhesion between the layers when a further layer is cast onto a crosslinked layer is frequently unsatisfactory.

Laser-engravable flexographic printing elements which have an opaque relief layer can also be produced by casting the layer and then crosslinking it thermally, for example with the use of monomers and thermal polymerization initiators. However, casting too permits only the production of layers having limited thickness since, with increasing layer thickness, layer defects are also increasingly caused during evaporation of the solvent. Flexographic printing plates have layer thicknesses of up to 7 mm. Such layer thicknesses are achievable as a rule only by means of repeated casting one on top of the other if high-quality layers are to be obtained, and the procedure is accordingly inconvenient and expensive. Furthermore, many substrate films no longer have sufficient dimensional stability at the temperatures of thermal crosslinking.

It is an object of the present invention to provide a process for the production of flexographic printing plates, in which the printing relief is engraved by means of a laser into relief layers which contain absorbers for laser radiation, and in which even thicker layers and any further layers present can be crosslinked in a single operation.

We have found that this object is achieved by the process described at the outset.

Regarding the present invention, the following may be stated specifically.

For the novel process, an elastomeric relief layer which comprises at least one elastomeric binder and at least one absorber for laser radiation is first applied to a dimensionally stable substrate. As a rule, the relief layer is opaque.

Examples of suitable dimensionally stable substrates include films of polyethylene terephthalate (PET), polyethylene naphthalate (PEN), polybutylene terephthalate, polyamide or polycarbonate, preferably PET or PEN films. Conical or cylindrical sleeves of said materials can also be used as substrates. Woven glass fiber fabrics or composite materials comprising glass fibers and suitable polymeric materials are also suitable for sleeves. Metallic substrates are in general not suitable for carrying out the process because they heat up excessively under electron beams, although this should not rule out their use in special cases.

The dimensionally stable substrate can optionally be coated with an adhesion-promoting layer for better adhesion of the relief layer.

The relief layer comprises at least one elastomeric binder. The choice of the binders is limited only in that relief layers suitable for flexographic printing have to be obtained. Suitable binders are chosen by those skilled in the art in accordance with the desired properties of the relief layer, for example with regard to hardness, resilience or ink transfer behavior.

Examples of suitable elastomers include substantially 3 groups, without it being intended to restrict the invention thereto.

The first group comprises those elastomeric binders which have ethylenically unsaturated groups. The ethylenically unsaturated groups are crosslinkable by means of electron beams. Such binders are, for example, those which contain 1,3-diene monomers, such as isoprene or butadiene, as polymerized units. The ethylenically unsaturated group can on the one hand act as a chain building block of the polymer (1,4 incorporation) or can be bonded as a side chain (1,2 incorporation) to the polymer chain. Examples are natural rubber, polybutadiene, polyisoprene, styrene/butadiene rubber, nitrile/butadiene rubber, acrylate/butadiene rubber, acrylonitrile/isoprene rubber, butyl rubber, styrene/isoprene rubber, polynorbornene rubber or ethylene/propylene/diene rubber (EPDM).

Further examples include thermoplastic elastomeric block copolymers of alkenyl aromatics and 1,3-dienes. The block copolymers may be both linear block copolymers and radial block copolymers. Usually, they are three-block copolymers of the A-B-A type, but they may also be two-block copolymers of the A-B type or those having a plurality of alternating elastomeric and thermoplastic blocks, e.g. A-B-A-B-A. Blends of two or more different block copolymers may also be used. Commercial three-block copolymers frequently contain certain proportions of two-block copolymers. The diene units may be 1,2- and/or 1,4-linked. Both block copolymers of the styrene/butadiene type and of the styrene/isoprene type may be used. They are commercially available, for example, under the name Kraton®. Thermoplastic elastomeric block copolymers having terminal blocks of styrene and a random styrene/butadiene middle block may also be used and are available under the name Styroflex®.

Further examples of binders having ethylenically unsaturated groups include modified binders in which crosslinkable groups are introduced into the polymeric molecule by grafting reactions.

The second group includes those elastomeric binders which have functional groups which are crosslinkable by means of electron beams. These are preferably functional side groups. However, they may also be groups which are integrated into the polymer chain. Examples of suitable functional groups include —OH, —$NH_2$, —NHR, —NCO, —CN, —COOH, —COOR, —$CONH_2$, —CONHR, —CO—, —CHO or —$SO_3H$, where R is in general an aliphatic or aromatic radical. Protic functional groups, for example —OH, —$NH_2$, —NHR, —COOH or —$SO_3H$, have proven particularly advantageous for the production of flexographic printing plates by means of electron beam crosslinking and laser engraving. Examples of binders include acrylate rubbers, ethylene/acrylate rubbers, ethylene/acrylic acid rubbers or ethylene/vinyl acetate rubbers and their partly hydrolyzed derivatives, thermoplastic elastomeric polyurethanes, sulfonated polyethylenes or thermoplastic elastomeric polyesters.

It is of course also possible to use elastomeric binders which have both ethylenically unsaturated groups and functional groups. Examples include copolymers of butadiene with (meth)acrylates, (meth)acrylic acid or acrylonitrile, and furthermore copolymers or block copolymers of butadiene or isoprene with styrene derivatives having functional groups, for example block copolymers of butadiene and 4-hydroxystyrene. Unsaturated thermoplastic elastomeric polyesters and unsaturated thermoplastic elastomeric polyurethanes are likewise suitable.

The third group of elastomeric binders includes those which have neither ethylenically unsaturated groups nor functional groups. Examples of these are ethylene/propylene elastomers, ethylene/1-alkylene elastomers or products obtained by hydrogenating diene units, for example SEBS rubbers.

It is of course also possible to use mixtures of two or more elastomeric binders, these being either binders comprising in each case only one of the groups described or mixtures of binders comprising two or all three groups. The possible combinations are limited only insofar as the suitability of the relief layer for flexographic printing may not be adversely affected by the binder combination. For example, a mixture of at least one elastomeric binder which has no functional groups with at least one other binder which has functional groups can advantageously be used.

The amount of elastomeric binder or binders in the relief layer is usually from 40 to 99, preferably from 50 to 95, very particularly preferably from 60 to 90, % by weight, based on the sum of all components.

The relief layer furthermore comprises at least one absorber for laser radiation. Mixtures of different absorbers for laser radiation may also be used. Suitable absorbers for laser radiation have high absorption in the range of the laser wavelength. In particular, absorbers which have a high absorption in the near infrared and in the longer-wave VIS range of the electromagnetic spectrum are suitable. Such absorbers are particularly suitable for the absorption of the radiation of powerful Nd-YAG lasers (1 064 nm) and of IR diode lasers, which typically have wavelengths of from 700 to 900 nm and from 1 200 to 1 600 nm.

Examples of suitable absorbers for the laser radiation in the infrared spectral range are strongly absorbing dyes, for example phthalocyanines, naphthalocyanines, cyanines, quinones, metal complex dyes, such as dithiolenes or photochromic dyes.

Other suitable absorbers are inorganic pigments, in particular intensely colored inorganic pigments, for example chromium oxides, iron oxides, hydrated iron oxides or carbon black.

Finely divided carbon black grades having a particle size of from 10 to 50 nm are particularly suitable as absorbers for laser radiation.

Most of the stated laser absorbers also have a high absorption in the UV and in the VIS range of the electromagnetic spectrum and accordingly have an intense color. The relief layers which contain these absorbers are therefore generally opaque or at least substantially translucent and hence not completely photochemically crosslinkable. At least 0.1% by weight, based on the sum of all components of the laser-engravable relief layer, of absorber is used. The amount of added absorber is chosen by a person skilled in the art according to the properties of the relief layer which are desired in each case. In this context, a person skilled in the art will furthermore take into account the fact that the added absorbers influence not only the speed and efficiency of the engraving of the elastomeric layer by laser but also other properties of the flexographic printing element, for example its hardness, resilience, thermal conductivity or ink acceptance. As a rule, more than 40% by weight, based on the sum of all components of the laser-engravable elastomeric layer, of absorbers for laser radiation are therefore unsuitable. The amount of the absorber for laser radiation is preferably from 1 to 30, particularly preferably from 5 to 20, % by weight.

The elastomeric relief layer can optionally also comprise low molecular weight or oligomeric compounds crosslinkable by means of electron beams. Oligomeric compounds generally have a molecular weight of not more than 20 000 g/mol. Low molecular weight and oligomeric compounds are to be referred to below as monomers for the sake of simplicity.

Monomers may be added on the one hand in order to increase the crosslinking rate if this is desired by a person skilled in the art. With the use of elastomeric binders from groups 1 and 2, the addition of monomers for acceleration is generally not absolutely necessary. In the case of elastomeric binders from group 3, the addition of monomers is as a rule advisable without being absolutely necessary in every case.

Regardless of the question of the crosslinking rate, monomers can also be used for controlling the crosslinking density in the course of the electron beam curing and for establishing the desired hardness of the crosslinked material. Depending on the type and amount of added low molecular weight compounds, more or less dense networks are obtained.

Monomers used may be, on the one hand, the known ethylenically unsaturated monomers which can also be used for the production of conventional photopolymer flexographic printing plates. The monomers should be compatible with the binders and have at least one ethylenically unsaturated group. They should not be readily volatile. The boiling point of suitable monomers is preferably not less than 150° C. Amides and esters of acrylic acid or methacrylic acid with mono- or polyfunctional alcohols, amines, amino alcohols or hydroxyethers and hydroxyesters, styrene or substituted styrenes, esters or fumaric or maleic acid or allyl compounds are proven [sic] particularly suitable. Examples include butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide.

It is also possible to use monomers which have at least one functional group crosslinkable under the action of electron beam curing. The functional group is preferably a protic group. Examples include —OH, —$NH_2$, —NHR, —COOH or —$SO_3H$. Di- or polyfunctional monomers in which terminal functional groups are linked to one another via a spacer can particularly preferably be used. Examples of such monomers include dialcohols, for example 1,4 butanediol [sic], 1,6-hexanediol, 1,8 octanediol [sic] or 1,9 nonanediol [sic], diamines, for example 1,6-hexanediamine or 1,8-hexanediamine, and dicarboxylic acids, for example oxalic acid, malonic acid, adipic acid, 1,6-hexanedicarboxylic acid, 1,8-octanedicarboxylic acid, 1,10-decanedicarboxylic acid, phthalic acid, terephthalic acid, maleic acid or fumaric acid.

It is also possible to use monomers which have both ethylenically unsaturated groups and functional groups. Examples are ω-hydroxyalkyl acrylates, such as ethylene glycol mono(meth)acrylate, 1,4-butanediol mono(meth) acrylate or 1,6-hexanediol mono(meth)acrylate.

It is of course also possible to use mixtures of different monomers, provided that the properties of the relief layer are not adversely affected by the mixture.

As a rule, the amount of added monomers is from 0 to 30, preferably from 0 to 20, % by weight, based on the amount of all components of the relief layer.

The elastomeric relief layer may furthermore comprise additives and assistants, for example dyes, dispersants, antistatic agents, plasticizers or abrasive particles. However, the amount of such additives should as a rule not exceed 20% by weight, based on the amount of all components of the elastomeric relief layer of the recording element.

The elastomeric relief layer may also be composed of a plurality of relief layers. These elastomeric part-layers may be of identical, roughly identical or different composition.

The thickness of the elastomeric relief layer or of all relief layers together is as a rule from 0.1 to 7 mm, preferably from 0.4 to 7 mm. The thickness is chosen suitably by a person skilled in the art in accordance with the desired use of the flexographic printing plate.

The flexographic printing element used as starting material can optionally furthermore have an upper layer having a thickness of not more than 100 $\mu$m. The composition of such an upper layer can be chosen with respect to optimum printing properties, for example ink transfer, while the composition of the relief layer underneath is chosen with respect to optimum hardness or resilience. The thickness is preferably from 5 to 80 $\mu$m, particularly preferably from 10 to 60 $\mu$m. The upper layer must either itself be laser-engravable or at least be removable in the course of the laser engraving, together with the relief layer underneath. It comprises at least one polymeric binder which need not necessarily be elastomeric. It can furthermore comprise an absorber for laser radiation or monomers or assistants.

The starting material for the process can be prepared, for example, by dissolving or dispersing all components in a suitable solvent and pouring onto a substrate. In the case of multilayer elements, a plurality of layers can be cast one on top of the other in a manner known in principle. Since the wet-on-wet method is used, the layers bind well to one another. An upper layer, too, can be cast on top. Alternatively, the individual layers can be cast, for example, on temporary substrates and the layers then united with one another by lamination. After the casting, a cover sheet can optionally also be applied for protecting the starting material from damage.

Very particularly advantageously, however, thermoplastic elastomeric binders are used for the novel process, and the production is carried out in a known manner by extrusion between a substrate film and a cover sheet or a cover element, followed by calendering, as disclosed, for example, by EP-A-084 851. In this way, it is possible also to produce thick layers in a single operation. Multilayer elements can be produced by means of coextrusion.

In process step (b), the relief layer is uniformly crosslinked by means of electron beams. If the flexographic printing element still has a protective film, this should generally be peeled off before the crosslinking. However, this is not always essential, particularly in the case of crosslinking by means of electron beams.

Suitable apparatuses for crosslinking by means of electron beams are known in principle to a person skilled in the art. The exposure to electrons can be carried out in line directly after the continuous production of the relief layer, for example directly after the calendering. However, the exposure to electrons can advantageously also be carried out in a separate process step.

During the uniform crosslinking, the flexographic printing element used as starting material is very uniformly exposed to electron beams. Ideally, the total surface of the flexographic printing element should be absolutely uniformly exposed, although in practice there are of course always certain variations. However, relatively large variations should be avoided. In order to achieve uniform exposure, the flexographic printing element should be placed as flat as possible on the supporting surface.

In the novel process, the flexographic printing elements are as a rule exposed only from the top of the elements. However, the present invention does of course also include the procedure whereby the element is exposed from the top and from the bottom.

The minimum total dose for crosslinking is 40 kGy (1 Gy=1 J/kg). The maximum irradiation dose is established by a person skilled in the art in accordance with the desired properties, for example hardness or restoring force of the flexographic printing plate. As a rule, however, it is not advisable to use more than 200 kGy for crosslinking and it is particularly preferable to use not more than 150 kGy for crosslinking. A total dose of from 60 to 120 kGy for irradiation has proven useful.

The energy of the electron beams is determined by a person skilled in the art according to the thickness and composition of the flexographic printing element. Said energy is decisive for the maximum depth of penetration of the electron beams in the relief layer. In the case of the relief layers which are used according to the invention and contain an absorber for laser radiation, it has however generally proven useful to use electron beams having an energy of at least 2 MeV.

The exposure to electrons can be carried out in such a way that the total dose is administered in a single irradiation process. The power of the dose should be very high in order to achieve very short exposure times. On the other hand, it must not be so high that the flexographic printing element heats up excessively, since otherwise the dimensional stability of the flexographic printing element might be impaired. Heating up to above 80° C. should be avoided. In order to achieve an optimum result, it is usually advantageous to use particularly thermally stable substrate films, for example those comprising PEN.

The irradiation is as a rule carried out in air, but in special cases can of course also be effected under inert gases, such as argon or nitrogen. If desired, the plates to be exposed can also be encapsulated for the exclusion of air.

It is furthermore advantageous to cool the flexographic printing element during the irradiation, for example by an air stream which is passed over, or by placing said element on a cooled supporting surface.

In a particularly advantageous embodiment of the novel process, the total dose of electron beam is distributed over two or more part-doses. The part-doses may be of equal or different magnitudes and the electron beams may have the same energy or different energy or the same or a different power of the dose.

The individual part-doses can follow directly in succession. However, they may also advantageously be interrupted for irradiation pauses of equal or different length. The irradiation may be interrupted only briefly or for a longer time. Irradiation pauses of more than 60 minutes between the individual doses should however be avoided. Irradiation pauses of from 1 to 30 minutes have proven useful.

Some embodiments for the crosslinking step by means of electron beams, which have proven particularly useful, are described in ore detail below.

In one embodiment for the electron beam crosslinking step, the energy of the electron beams is identical or virtually identical for all administered part-doses. After each part-dose, an irradiation pause is maintained. Irradiation is preferably effected with a relatively high power of the dose, with the result that the relief layer heats up considerably. Temperatures of more than 100° C. should however be avoided. In the irradiation causes, the relief layer may react and cool again.

In a further embodiment, the energy of the electron beams in the case of at least one of the administered part-doses differs from that of the other part-doses. For example, the energy of the electron beams of the part-doses administered first can be chosen so that the flexographic printing element is crosslinked through the total depth of the relief, whereas the energy of the electron beams of the part-dose administered last is such that further crosslinking is effected only in a thin layer at the surface. It is thus possible to obtain a flexographic printing plate which has a relatively soft lower layer and a comparatively harder upper layer.

The energy of the electron beams may also differ for all part-doses. This also permits crosslinking profiles of different types. For example, it is possible to start with the part-dose for which the electron beams have the highest energy and then to reduce the electron energy for each further part-dose. In this manner, it is possible to obtain a flexographic printing plate in which the crosslinking density of the relief layer increases stepwise from the substrate film to the printing surface.

It has proven useful in all embodiments to use electron beams having an energy of at least 2 MeV, at least in one of the steps.

In a further embodiment, a plurality of flexographic printing elements can also be stacked one on top of the other to increase the efficiency. In order to achieve uniform crosslinking, it is advisable here too to effect irradiation in a plurality of part-doses and to change the sequence of flexographic printing elements cyclically in the stack for each irradiation. It is also possible initially to irradiate a complete stack once or several times and, in a final step, to harden the surface for the elements individually in a controlled manner using electron beams having a small depth of penetration.

In process step (c), a printing relief is engraved by means of a laser into the layer crosslinked by means of electron beams. Advantageously, image elements in which the sidewalls of the image elements initially fall away perpendicularly and do not broaden until the lower region of the image elements are engraved. A good shoulder shape in combination with a small increase in tonal value is thus achieved. However, it is also possible to engrave dot sidewalls of another shape.

IR lasers are particularly suitable for laser engraving. However, it is also possible to use lasers having shorter wavelengths, provided that the laser has sufficient intensity. For example, a frequency-doubled (532 nm) or frequency-tripled (355 nm) Nd-YAG laser or eximer [sic] laser (e.g. 248 nm) can also be used. If required for removal of material, absorbers for laser irradiation which are appropriately adapted to the laser wavelength to be used in each case must be used.

For example, a $CO_2$ laser having a wavelength of 10 640 nm can be used for laser engraving. Lasers having a wavelength of from 600 to 2 000 nm are particularly advantageously used. For example, Nd-YAG lasers (1 064 nm), IR diode lasers or solid-state lasers can be used. Nd-YAG lasers are particularly preferred for carrying out the novel process. The image information to be engraved is transmitted directly from the layout computer system to the laser apparatus. The lasers can be operated either continuously or in a pulsed manner.

As a rule, the flexographic printing plate obtained can be used directly. If desired, however, the flexographic printing plate obtained can also be subsequently cleaned. As a result of said cleaning step, layer components which have become detached but may not have been completely removed from the plate surface are removed. As a rule, simple treatment with water, water/surfactant or alcohol is entirely sufficient.

The novel process can be carried out in a single production operation in which all process steps are carried out in succession. Advantageously, however, the process can also be interrupted after process step (b). The crosslinked, laser-engravable recording element can be made up and stored and further processed only later by means of laser engraving to give a flexographic printing plate or flexographic sleeve. It is advantageous here to protect the flexographic printing element, for example with a temporary cover sheet, for example of PET, which of course has to be peeled off again before the laser engraving.

The novel process has a number of important advantages over the prior art:

It permits the production of flexographic printing plates whose relief layers comprise absorbers for laser radiation also with large layer thickness and high quality. Only one operation is required for the crosslinking.

In the course of the electron beam crosslinking, the adhesion between the substrate film and the relief layer is also substantially improved. The same applies to the adhesion between an optionally present upper layer and the relief layer.

The division of the total radiation dose into a plurality of part-doses whose electron beams have different energies makes crosslinking profiles accessible in a simple manner. In this way, for example, flexographic printing elements having a hardened surface can be obtained. Hardened surfaces have the advantage that no fusion edges are formed around the engraved relief elements during engraving by means of lasers. Fusion edges give rise to impairment of the printed image during printing. Furthermore, such plates have high abrasion resistance.

The thermal stress on the flexographic printing element in the course of the crosslinking can be substantially reduced in comparison with thermal crosslinking or even virtually completely avoided. This leads to flexographic printing plates having substantially improved dimension stability and hence to substantially better printing quality.

The examples which follow illustrate the invention.

EXAMPLE 1

A relief layer comprising a binder having ethylenically unsaturated groups was produced. The following components were used for the relief layer.

| Components | Starting materials | Amount [% by wt.] |
|---|---|---|
| Binder | Polybutadiene rubber (high vinyl content) | 68.5 |
| Absorber for laser radiation | Finely divided carbon black | 10.0 |
| Monomers | Lauryl acrylate | 10.0 |
| Additives | Polybutadiene oil (plasticizer) | 10.0 |
| | Heat stabilizer | 1.5 |

Binder, additives and absorber for laser radiation were mixed in a laboratory kneader at a material temperature of 150° C. After 15 minutes, the absorber for laser radiation had been homogeneously dispersed. The compound thus obtained was dissolved together with the monomer at 80° C. in toluene, cooled to 60° C. and cast onto an uncoated, 125 μm thick PET film. After drying in air for 24 hours at room temperature and drying for 3 hours at 60° C., the relief layer obtained (layer thickness 900 μm) was laminated with a second, 125 μm thick PET film coated with a mixture of adhesive-forming components. Before the further treatment, the element was stored for 1 week at room temperature.

EXAMPLE 2

A relief layer comprising a binder mixture having ethylenically unsaturated groups was produced. The following components were used for the relief layer.

| Components | Starting materials | Amount [% by wt.] |
|---|---|---|
| Binders | EPDM rubber comprising 5% by weight of ethylidenenorbornene as a termonomer | 75.5 |
| | Polybutadiene rubber (high vinyl content | 4.0 |
| Absorber for laser radiation | Finely divided carbon black | 10.0 |
| Monomers | Lauryl acrylate | 7.5 |
| | Trimethylolpropane trimethacrylate | 1.5 |
| Additives | Heat stabilizer, dispersant | 1.5 |

Binders, additives and absorber for laser radiation were mixed in a laboratory kneader at a material temperature of 170° C. After 15 minutes, the absorber for laser radiation had been homogeneously dispersed. The compound thus obtained was dissolved together with the monomers at 80° C. in toluene, cooled to 60° C. and cast onto an uncoated, 125 μm thick PET film. After drying in air for 24 hours at room temperature and drying for 3 hours at 60° C., the relief layer obtained (layer thickness 800 μm) was laminated with a second, 175 μm thick PET film coated with a mixture of adhesive-forming components. Before the further treatment, the element was stored for 1 week at room temperature.

EXAMPLE 3

A relief layer comprising a binder having ethylenically unsaturated groups was produced by means of extrusion and subsequent calendering between a cover sheet and substrate film. The following components were used for the relief layer.

| Components | Starting materials | Amount [% by wt.] |
|---|---|---|
| Binder | SIS three-block copolymer comprising 15% by weight of styrene (Kraton D-1161, from Kraton Polymers) | 80.0 |
| Absorber for laser radiation | Finely divided carbon black | 6.0 |
| Monomers | Hexanediol diacrylate | 6.0 |
| | Hexanediol dimethacrylate | 6.0 |
| Additives | Heat stabilizer, antiozonant wax | 2.0 |

The components were thoroughly mixed with one another in a twin-screw extruder at a material temperature of 140–160° C., extruded through a slot die and then calendered between a cover sheet and substrate film. The thickness of the relief layer was 860 μm. Before the further treatment, the element was stored for 1 week at room temperature.

EXAMPLE 4 (COMPARATIVE EXAMPLE)

A relief layer comprising a binder having ethylenically unsaturated groups was produced by means of extrusion and subsequent calendering between a cover sheet and a substrate film. The following components were used for the relief layer.

| Components | Starting materials | Amount [% by wt.] |
|---|---|---|
| Binder | SIS three-block copolymer comprising 15% by weight of styrene (Kraton D-1161, from Kraton Polymers) | 79.0 |
| Absorber for laser radiation | Finely divided carbon black | 6.0 |
| Photoinitiator | Benzil dimethyl ketal | 1.0 |
| Monomers | Hexanediol diacrylate | 6.0 |
| | Hexanediol dimethacrylate | 6.0 |
| Additives | Heat stabilizer, antiozonant wax | 2.0 |

The components were thoroughly mixed with one another in a twin-screw extruder at a material temperature of 140–160° C., extruded through a slot die and then calendered between a cover sheet and a substrate film. The thickness of the relief layer was 850 μm. Before the further treatment, the element was stored for 1 week at room temperature.

Electron Beam Crosslinking

An electron beam apparatus (nominal power about 150 kW) which can produce electron beams having electron energies of 2.5–4.5 MeV was used for the crosslinking. The elements to be exposed to the electron beams were transported through the electron irradiation zone by means of aluminum pallets which were freely suspended vertically and were connected to a guided conveyor belt by means of a mobile suspension so that uniform transport of the aluminum pallets through the electron irradiation zone could be effected by controlling the conveyor belt speed.

Crosslinking by Exposure to UV-A Light

For crosslinking by exposure to UV-A light, the elements to be crosslinked were exposed for a specific, predetermined time in an F III exposure unit from BASF Drucksysteme GmbH under reduced pressure.

For this purpose, the protective cover sheet of the relevant element was first removed and a transparent, UV-permeable non-tacky relief film was then placed on the element to be exposed, in order to prevent adhesion of the element surface to the vacuum film. After the element to be exposed had been covered with the vacuum film and the reduced pressure had been switched on, the element was exposed uniformly to UV light for the specified duration.

EXAMPLE 5

A total of 6 elements according to example 1 were used, of which 1 element was retained as a reference (sample No. 0). The energy of the electron beams was about 3.0 MeV. A gradual irradiation series comprising 5 identical part-doses of 20 kGy each was carried out. The waiting time between 2 part-doses was 20 minutes in each case. After each part-dose, an element was removed from the irradiation loop and the remaining elements were turned through 180° C. before administration of the next part-dose.

The table below shows the properties of the resulting flexographic printing element as a function of the irradiation dose.

| No. | Part-dose [kGy] | Total dose [kGy] | Swelling in toluene* [% by wt.] | Gel content# [% by wt.] | Mech. hardness (DIN 53505) [Shore A] |
|---|---|---|---|---|---|
| 0 | — | — | ∞ | 0 | |
| 1 | 20 | 20 | 447 | 77 | 72 |
| 2 | 20 | 40 | 266 | 86 | 74 |
| 3 | 20 | 60 | 205 | 91 | 78 |
| 4 | 20 | 80 | 180 | 93 | 80 |
| 5 | 20 | 100 | 180 | 94 | 81 |

*Value after swelling for 24 hours at room temperature in a 50-fold excess of toluene

#Value after swelling for 24 hours at room temperature in a 50-fold excess of toluene and redrying for 6 hours at 80° C. under reduced pressure.

EXAMPLE 6

A total of 9 elements according to example 2 were used, of which 1 element was retained as a reference (sample No. 0). The energy of the electron beams was about 3.0 MeV. A gradual irradiation series comprising 8 part-doses, some of which differed, was carried out. The specific part-doses were in succession 23, 22, 22, 35, 42, 30, 30 and 29 kGy. The waiting time between 2 part-doses was 20 minutes in each case. After each part-dose, an element was removed from the irradiation loop and the remaining elements were turned through 180° before administration of the next part-dose.

The table below shows the properties of the resulting flexographic printing element as a function of the irradiation dose.

| No. | Part-dose [kGy] | Total dose [kGy] | Swelling in toluene* [% by wt.] | Gel content# [% by wt.] | Mech. hardness (DIN 53505) [Shore A] |
|---|---|---|---|---|---|
| 0 | — | — | ∞ | 0 | |
| 1 | 23 | 23 | 444 | 90 | 72 |
| 2 | 22 | 45 | 274 | 94 | 72 |

-continued

| No. | Part-dose [kGy] | Total dose [kGy] | Swelling in toluene* [% by wt.] | Gel content# [% by wt.] | Mech. hardness (DIN 53505) [Shore A] |
|---|---|---|---|---|---|
| 3 | 22 | 67 | 199 | 96 | 72 |
| 4 | 35 | 102 | 167 | 98 | 73 |
| 5 | 42 | 144 | 157 | 97 | 74 |
| 6 | 30 | 174 | 162 | 97 | 74 |
| 7 | 30 | 204 | 129 | 98 | 74 |
| 8 | 29 | 233 | 121 | 98 | 74 |

*Value after swelling for 24 hours at room temperature in a 50-fold excess of toluene
#Value after swelling for 24 hours at room temperature in a 50-fold excess of toluene and redrying for 6 hours at 80° C. under reduced pressure.

EXAMPLE 7

A total of 9 elements according to example 3 were used, of which 1 element was retained as a reference (sample No. 0). The energy of the electron beams was about 3.0 MeV. A gradual irradiation series comprising 8 part-doses, some of which differed, was carried out. The specific part-doses were in succession 23, 22, 22, 35, 42, 30, 30 and 29 kGy. The waiting time between 2 part-doses was 20 minutes in each case. After each part-dose, an element was removed from the irradiation loop and the remaining elements were turned through 180° before administration of the next part-dose.

The table below shows the properties of the resulting flexographic printing element as a function of the irradiation dose.

| No. | Part-dose [kGy] | Total dose [kGy] | Swelling in toluene* [% by wt.] | Gel content# [% by wt.] | Mech. hardness (DIN 53505) [Shore A] |
|---|---|---|---|---|---|
| 0 | — | — | ∞ | 0 | |
| 1 | 23 | 23 | ∞ | 0 | 39 |
| 2 | 22 | 45 | 828 | 77 | 52 |
| 3 | 22 | 67 | 430 | 87 | 58 |
| 4 | 35 | 102 | 431 | 89 | 63 |
| 5 | 42 | 144 | 331 | 92 | 65 |
| 6 | 30 | 174 | 322 | 93 | 67 |
| 7 | 30 | 204 | 260 | 94 | 68 |
| 8 | 29 | 233 | 260 | 94 | 68 |

*Value after swelling for 24 hours at room temperature in a 50-fold excess of toluene
#Value after swelling for 24 hours at room temperature in a 50-fold excess of toluene and redrying for 6 hours at 80° C. under reduced pressure.

EXAMPLE 8 (COMPARATIVE EXAMPLE)

A total of 6 elements according to example 4 were used, of which 1 element was retained as a reference (sample No. 0). An irradiation series with UVA light was carried out as described above using the following individual exposure times: 1, 5, 15, 30 and 60 min.

The table below shows the properties of the resulting flexographic printing element as a function of the UVA exposure time.

| No. | Duration of the UVA exposure [min] | Swelling in toluene* [% by wt.] | Gel content# [% by wt.] | Mech. hardness (DIN 53505) [Shore A] |
|---|---|---|---|---|
| 0 | 0 | ∞ | 0 | |
| 1 | 1 | ∞ | 0 | 32 |
| 2 | 5 | ∞ | 0 | 33 |
| 3 | 15 | ∞ | 1 | 35 |
| 4 | 30 | ∞ | 3 | 36 |
| 5 | 60 | ∞ | 2 | 34 |

*Value after swelling for 24 hours at room temperature in a 50-fold excess of toluene
#Value after swelling for 24 hours at room temperature in a 50-fold excess of toluene and redrying for 6 hours at 80° C. under reduced pressure.

Laser Engraving of the Irradiated Flexographic Printing Elements

The irradiated flexographic printing elements obtained were engraved using a $CO_2$ laser (from ALE, Meridian Finesse, 250 W, engraving speed=200 cm/s) and an Nd-YAG laser (from ALE, Meridian Finesse, 100 W, engraving speed=100 cm/s). A test pattern consisting of solid areas and various line work was engraved into the respective flexographic printing element. The line work measuring 1 cm×1 cm in each case consisted of parallel, individual negative lines having an identical line width and identical line spacing per line element. A list of the engraved line work is shown in the table below.

| Line element No. | Width of the negative lines [μm] | Spacing of the negative lines [μm] |
|---|---|---|
| 1 | 20 | 20 |
| 2 | 40 | 40 |
| 3 | 60 | 60 |
| 4 | 80 | 80 |
| 5 | 100 | 100 |
| 6 | 200 | 200 |
| 7 | 500 | 500 |
| 8 | 1000 | 1000 |

The quality of the laser-engraved flexographic printing element was assessed with the aid of an optical microscope which has a means for measuring distances or heights and depths.

For this purpose, the gravure depth was measured in the uniformly engraved part. Furthermore, the finest line work for which the engraved individual lines were completely resolved from one another under the microscope was determined. The individual lines were assessed as being completely resolved from one another if the surface of the positive line element remaining between the negative line had a width of at least 5 μm and this surface had the same height as the unengraved parts of the positive solid area within a difference of 20 μm. In this method of assessment, a low number for the finest line element still reproduced accordingly corresponds to good gravure quality, whereas a high number corresponds to a lower resolution and hence poorer gravure quality.

Finally, in particular fusion edges and deposits in the edge zones of the negative elements and solid areas were visually assessed.

| Ex. No. | Type of cross linking | Cross linking conditions | Laser type | Fusion edges (visually) | Engraving depth [$\mu$m] | Finest line element [No.] |
|---|---|---|---|---|---|---|
| 5 | EB | 60 kGy | $CO_2$ | Few | 760 | 3 |
| 5 | EB | 80 kGy | $CO_2$ | None | 830 | 1 |
| 5 | EB | 60 kGy | Nd-YAG | Few | 810 | 2 |
| 5 | EB | 80 kGy | Nd-YAG | None | 830 | 1 |
| 6 | EB | 67 kGy | $CO_2$ | Moderate | 640 | 3 |
| 6 | EB | 102 kGy | $CO_2$ | Few | 700 | 2 |
| 6 | EB | 67 kGy | Nd-YAG | Moderate | 660 | 3 |
| 6 | EB | 102 kGy | Nd-YAG | Few | 690 | 2 |
| 7 | EB | 102 kGy | $CO_2$ | Moderate | 650 | 2 |
| 7 | EB | 144 kGy | $CO_2$ | None | 710 | 2 |
| 7 | EB | 102 kGy | Nd-YAG | Moderate | 660 | 2 |
| 7 | EB | 144 kGy | Nd-YAG | None | 680 | 1 |
| 8 | UVA | 15 min | $CO_2$ | Very pronounced | 390 | 7 |
| 8 | UVA | 60 min | $CO_2$ | Pronounced | 480 | 5 |
| 8 | UVA | 15 min | Nd-YAG | Very pronounced | 430 | 6 |
| 8 | UVA | 60 min | Nd-YAG | Very pronounced | 450 | 5 |

Examples No. 5 to 7 show that fine relief elements of good quality and without pronounced fusion phenomena can be reproduced using the novel laser-engravable flexographic printing elements, in contrast to comparative example No. 8. Moreover, a greater gravure depth is surprisingly achieved using the novel flexographic printing elements than with a laser-engravable flexographic printing element according to the prior art (comparative example No. 8).

In addition, all electron beam crosslinked flexographic printing elements according to example No. 7 surprisingly have substantially greater adhesion to the substrate than the UV-crosslinked flexographic printing elements according to comparative example No. 8.

We claim:

1. A process for the production of flexographic printing plates by means of laser engraving, comprising the following steps:

a) application of at least one elastomeric relief layer to a dimensionally stable substrate, the relief layer comprising at least one elastomeric binder and at least one absorber for laser radiation, b) uniform crosslinking of the relief layer, c) engraving of a printing relief into the crosslinked relief layer by means of a laser, wherein the uniform crosslinking is carried out by means of electron beams in a minimum total dose of 40 kGy.

2. A process as claimed in claim 1, wherein, in a step (a'), an upper layer having a thickness of not more than 100 $\mu$m is furthermore applied, the upper layer comprising at least one polymeric binder.

3. A process as claimed in claim 1, wherein the electron beams have an energy of at least 2 MeV.

4. A process as claimed in claim 1, wherein the total dose of electron beams is distributed over two or more part-doses.

5. A process as claimed in claim 4, wherein the irradiation is stopped for an irradiation pause after the administration of any part-dose.

6. A process as claimed in claim 4, wherein the energy of the electron beam is identical for each of the administered part-doses.

7. A process as claimed in claim 4, wherein the energy of the electron beam for at least one of the administered part-doses differs from that of the other part-doses.

8. A process as claimed in claim 4, wherein the energy of the electron beam differs for all administered part-doses.

9. A process as claimed in claim 8, wherein the initial part-dose is the one in which the electron beam has the highest energy, and the energy for each further part-dose decreases stepwise.

10. A process as claimed in claim 4, wherein at least one of the part-doses has an energy of at least 2 MeV.

11. A process as claimed in claim 1, wherein a total dose of 200 kGy is not exceeded.

12. A process as claimed in claim 1, wherein a total dose of 150 kGy is not exceeded.

13. A process as claimed in claim 1, wherein the irradiation is carried out using electrons in air.

14. A process as claimed in claim 1, wherein the elastomeric binder has ethylenically unsaturated groups.

15. A process as claimed in claim 1, wherein the elastomeric binder has functional groups crosslinkable under the action of electron beams.

16. A process as claimed in claim 15, wherein the functional groups are protic groups.

17. A process as claimed in claim 1, wherein the elastomeric binder has ethylenically unsaturated groups and functional groups crosslinkable under the action of electron beams.

18. A process as claimed in claim 1, wherein a mixture of at least one elastomeric binder which has no functional groups with at least one further binder which has functional groups is used.

19. A process as claimed in claim 1, wherein the relief layer furthermore comprises at least one low molecular weight or oligomeric compound crosslinkable by means of electron beams.

20. A process as claimed in claim 19, wherein the low molecular weight compound is an ethylenically unsaturated monomer.

21. A process as claimed in claim 19, wherein the low molecular weight or oligomeric compound is a compound having functional groups.

22. A process as claimed in claim 21, wherein the functional groups are protic groups.

23. A process as claimed in claim 1, wherein the elastomeric binder is a thermoplastic elastomeric binder and the relief layer is produced by extrusion followed by calendering.

24. A process as claimed in claim 1, wherein the relief layer is opaque.

25. A process as claimed in claim 1, wherein the laser engraving (c) is carried out using a laser having a wavelength of 600–2000 nm.

26. A process as claimed in claim 25, wherein the laser engraving (c) is carried out using an Nd-YAG laser.

27. A flexographic printing plate obtainable as claimed in claim 1.

* * * * *